US007611920B1

United States Patent
Jost

(12) United States Patent
(10) Patent No.: US 7,611,920 B1
(45) Date of Patent: Nov. 3, 2009

(54) PHOTONIC COUPLING SCHEME FOR PHOTODETECTORS

(75) Inventor: Steven R. Jost, Amherst, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 148 days.

(21) Appl. No.: 11/601,223

(22) Filed: Nov. 17, 2006

Related U.S. Application Data

(60) Provisional application No. 60/737,568, filed on Nov. 17, 2005.

(51) Int. Cl.
*H01L 21/20* (2006.01)

(52) U.S. Cl. .............................. 438/57; 438/35; 438/50; 438/92; 438/99; 257/E21.152; 257/E21.153; 257/E21.161; 257/E21.464; 257/E21.573

(58) Field of Classification Search ................ 438/13, 438/57, 95, 35, 50, 52, 92, 99; 257/E21.152; 257/153, 161, 464, 573, E27.16
See application file for complete search history.

(56) References Cited

U.S. PATENT DOCUMENTS

| | | | | |
|---|---|---|---|---|
| 2,953,690 A * | 9/1960 | Lawson et al. | ........... | 250/214.1 |
| 3,222,520 A * | 12/1965 | McNaney | ................... | 250/330 |
| 3,867,757 A * | 2/1975 | Ennulat et al. | ................. | 438/13 |
| 4,106,046 A * | 8/1978 | Nathanson et al. | .......... | 257/234 |
| 4,183,664 A * | 1/1980 | Rambauske | ................. | 356/3.14 |
| 4,602,158 A * | 7/1986 | Barrett | .................... | 250/338.4 |
| 5,072,109 A * | 12/1991 | Aguilera et al. | ............. | 250/226 |
| 6,690,012 B1 * | 2/2004 | Jacksen et al. | ........... | 250/338.1 |
| 6,953,705 B2 * | 10/2005 | Prakash | ....................... | 438/99 |
| 6,995,371 B2 * | 2/2006 | Garber et al. | ............... | 250/330 |
| 7,262,413 B2 * | 8/2007 | Kauffman et al. | ......... | 250/338.4 |

* cited by examiner

Primary Examiner—Michael S Lebentritt
(74) Attorney, Agent, or Firm—Daniel J. Long

(57) ABSTRACT

A room temperature operation polycrystalline infrared responsive photodetector, manufactured by a process, comprising the steps of patterning vacuum-deposited material and dry-etching a photonic crystal structure with resonant coupling tuned to long wavelengths.

8 Claims, 2 Drawing Sheets

Drawings

PHOTONIC COUPLING SCHEME FOR PHOTODETECTORS

CROSS REFERENCE TO RELATED APPLICATION

This application claims rights under 35 USC § 119 (e) from U.S. application Ser. No. 60/737,568; filed: Nov. 17, 2005, the contents of which are incorporated herein by reference.

STATEMENT OF GOVERNMENT INTEREST

The invention was made with United States Government support under Contract No. S04-30. The United States Government has certain rights in this invention.

BACKGROUND OF THE INVENTION

1. Field of the Invention

The present invention relates to photoconductors and, more particularly, to near-room temperature operation polycrystalline infrared responsive photodetectors.

2. Brief Description of Prior Developments

Near-room temperature operation polycrystalline infrared responsive photodetectors such as the lead salts exhibit enhanced carrier lifetime due to majority carrier exclusion near the detector surface. This phenomenon limits responsivity to photons that are absorbed within a minority carrier diffusion length of this exclusion region and therefore skew the spectral response to shorter wavelengths due to the decrease in absorption coefficient as the photon energy approaches the band edge. In a thin film PbSe photoconductor, this limited responsivity can restrict the cutoff wavelength to shorter wavelengths and results in a lower internal quantum efficiency.

A need, therefore, exists for a way to increase internal quantum efficiency and to increase surface area for longer wavelength photons.

SUMMARY OF INVENTION

According to the present invention, by patterning vacuum deposited material and dry etching a "photonic crystal" structure with resonant coupling tuned to longer wavelengths, the resulting device offers significantly more surface area (photon absorption volume) for longer wavelength photons. This enhances longer wavelength response and increases overall internal quantum efficiency. The additional surface area is parallel to the light path and so for film thicknesses significantly greater than the exclusion layer depth, this creates a longer absorption path for photons.

BRIEF DESCRIPTION OF THE DRAWINGS

The present invention is further described with reference to the accompanying drawings wherein.

DETAILED DESCRIPTION

To enhance absorption and minimize dark current, resonant cavity structures coupled with thin lead salt layers have been modeled. Thinner material reduces dark current and the associated detector noise but becomes problematic for photon absorption (especially at longer wavelengths). Initial results on the Army's Low Cost Threat Warning effort have consistently fallen short of the nominal PbSe cutoff wavelength (4.4 μm-5 μm @ 20 C). Resonant cavity structures have shown predicted enhancement when targeted below 4 μm, but until the development of a growth process that resulted in larger crystallites, efforts to achieve longer cutoff wavelengths were unsuccessful.

While encouraged by the new larger crystallite growth process, sufficiently thin films to achieve readout-compatible dark current still exhibit less-than-desirable response at wavelengths beyond 4 microns. Commercial PbSe suppliers overcome this difficulty by compensating the material with halogens, which significantly lowers the mobility, and hence raises the resistance and enables thicker absorption layers. Unfortunately, detectors made from this material require higher bias voltages than are CMOS compatible to achieve reasonable signal levels.

Recent advances in photonic crystal physics have focused my thinking on more efficient coupling of light into materials. Simulations of a photon coupling structure predict significant improvement in longer wave response in thin layers of PbSe. The simulation is based on a two-dimensional geometric photonic crystal structure. Geometric considerations selectively enhance response at the longer wavelengths due to longer absorption lengths and better longer wavelength photon coupling. One predicted benefit of this structure is improved responsivity across the entire spectral band of interest.

The models have been validated by etching the coupling structure on to some portions of a wafer of polycrystalline material. To create the required structural variation, we rely on the uniform orientation of the vacuum-deposited material and a proprietary dry-etch process that permits patterning to micron-dimension levels. The photon coupling structure was optimized for wavelengths beyond 4 microns. Spectral response for the photonic coupling structure and normal material are shown for a suitable conventional lead salt.

Figure 1:
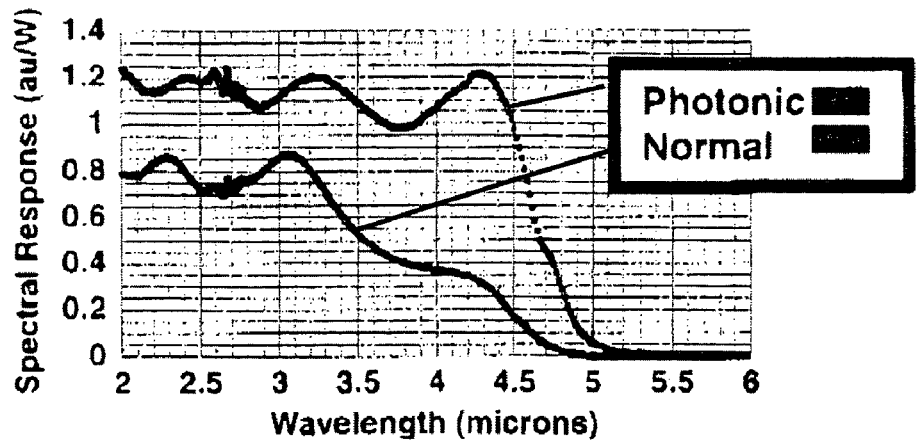
FIG. 1 is a graph of spectral response versus wavelength for a preferred embodiment of the photodetector of the present invention.

Referring to FIG. 1, spectral responsivity for two test samples of the lead salt referred to above. One sample is etched with the photonic crystal coupling structure and the other prepared in the normal way. The photonic crystal device exhibits significantly enhanced longer wavelength response.

This surprising and unexpected result will permit lead selenide to achieve the NRL red band (4.7 μm) for missile warning at temperatures as low as 0° C. Conventional PbSe material must be operated at −78° C. (195° K.) to achieve this cutoff at sufficiently low dark current to be of value to the tactical community.

Figure 2:
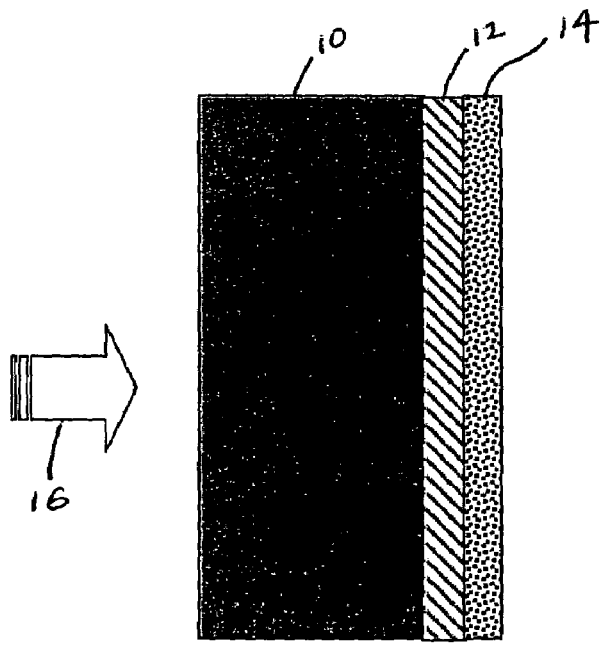
FIG. 2 is a vertical cross sectional view of a preferred embodiment of the photodetector of the present invention.

Referring to FIG. 2, there is a PbSe (t μm) layer 10, an enhanced lifetime PbSe layer (X μm) 12, and an oxidized surface 14. Photons are shown at numeral 16. The equation for calculating the photosignal in this embodiment is as follows:

$$\text{Photosignal} = \text{Area}(1 - \exp[-\alpha(\lambda)X])$$

Figure 3:
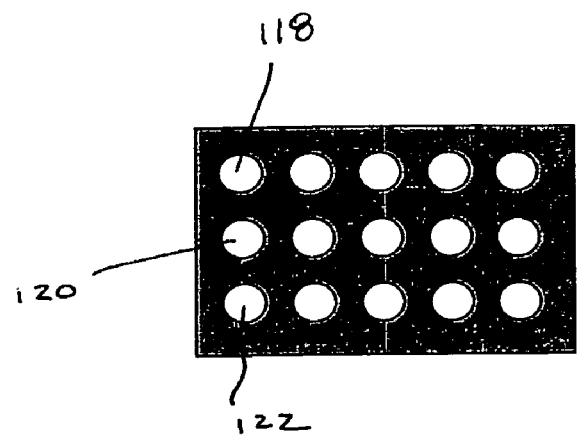
FIG. 3 is a top plan view of another preferred embodiment of the photodetector of the present invention.
Figure 4:
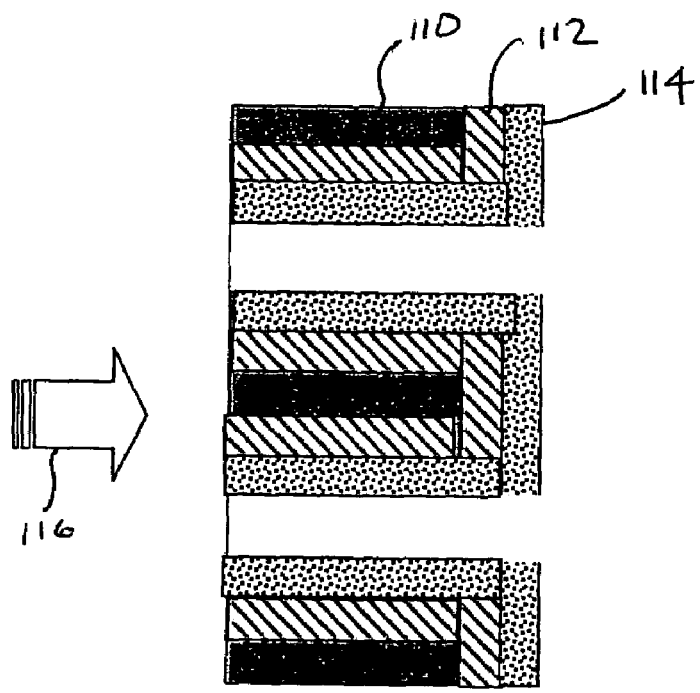
FIG. 4 is a horizontal cross sectional view of the photodetector shown in FIG. 3 through 4-4 in FIG. 3.

Referring to FIGS. 3 and 4, there are a plurality of vertical holes as at holes 118, 120, and 122. there are also PbSe (t μm) layers as at layer 110, enhanced lifetime PbSe (X μm) layers as at layer 112 and oxidized surfaces as at oxidized surface 114. Photons are shown at numeral 116. The holes are etched into the optimal two dimensional photonic grid for longer wavelengths. The longer absorption path in active volume around the holes enhances the photosignal. Material removal reduces detector dark current. The equation for calculating the photosignal in this embodiment is as follows:

$$\text{Photosignal} = [\text{Area} - \text{Holes}](1 - \exp[-\alpha(\lambda)X]) + (2\pi RX)(\text{\# of holes})(1 - \exp[-\alpha(\lambda)t])$$

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A room temperature operation polycrystalline infrared responsive photodetector, manufactured by a process comprising the steps of:
    patterning vacuum-deposited material; and
    dry-etching a photonic crystal structure with resonant coupling tuned to long wavelengths which are equal to or greater than about 4 microns.

2. The photodetector of claim 1, wherein the photonic crystal structure is a two-dimensional geometric photonic crystal structure.

3. The photodetector of claim 1, wherein the photodetector is comprised of an inner lead salt layer, a medically enhanced lifetime lead salt layer, and an outer oxidized surface.

4. The photodetector of claim 3, wherein the lead salt layers are comprised of lead selenide.

5. The photodetector of claim 3, wherein the outer oxidized surface is a photon receiving surface.

6. The photodetector of claim 1, wherein said photodetector has a plurality of transverse apertures and each of said transverse apertures is abutted by an outward oxidized layer and each of said outward oxidized layers is abutted by a further outward enhanced lifetime lead salt layer and each of said enhanced lifetime lead salt layer is abutted by a further outward lead salt layer.

7. The photodetector of claim 6, wherein the lead salt layers are comprised of lead selenide.

8. The photodetector of claim 6, wherein photons traveling parallel to the transverse apertures.

* * * * *